(12) United States Patent
Li et al.

(10) Patent No.: US 12,002,913 B2
(45) Date of Patent: Jun. 4, 2024

(54) DISPLAY BACKPLANE AND FABRICATION METHOD THEREOF, DISPLAY PANEL AND FABRICATION METHOD THEREOF

(71) Applicant: BOE Technology Group Co., Ltd., Beijing (CN)

(72) Inventors: Haixu Li, Beijing (CN); Guangcai Yuan, Beijing (CN); Zhanfeng Cao, Beijing (CN); Ke Wang, Beijing (CN); Qi Qi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 470 days.

(21) Appl. No.: 17/417,660

(22) PCT Filed: Oct. 22, 2020

(86) PCT No.: PCT/CN2020/122922
§ 371 (c)(1),
(2) Date: Jun. 23, 2021

(87) PCT Pub. No.: WO2022/082636
PCT Pub. Date: Apr. 28, 2022

(65) Prior Publication Data
US 2022/0344557 A1    Oct. 27, 2022

(51) Int. Cl.
*H01L 33/00* (2010.01)
*H01L 33/62* (2010.01)

(52) U.S. Cl.
CPC ............ *H01L 33/62* (2013.01); *H01L 33/005* (2013.01); *H01L 2933/0066* (2013.01)

(58) Field of Classification Search
CPC ....... H01L 33/00; H01L 33/62; H01L 33/005; H01L 33/24; H01L 33/08; H01L 33/48; H01L 33/56; H01L 33/60; H01L 33/50; H01L 33/54; H01L 33/505; H01L 33/502; H01L 33/486; H01L 25/16; H01L 25/075; H01L 25/0753; H01L 25/167; H01L 2933/0066
USPC ........................................................... 257/79
See application file for complete search history.

(56) References Cited

U.S. PATENT DOCUMENTS

| | | | |
|---|---|---|---|
| 2018/0122836 A1* | 5/2018 | Kang | ...................... H01L 33/60 |
| 2023/0006170 A1* | 1/2023 | Yoo | ...................... H10K 50/813 |

* cited by examiner

*Primary Examiner* — Chuong A Luu
(74) *Attorney, Agent, or Firm* — Nath, Goldberg & Meyer; Joshua B. Goldberg

(57) ABSTRACT

The present disclosure provides a display backplane including an array substrate including at least one pixel unit each including at least one TFT; a planarization layer covering the array substrate; a pad layer including pads on the planarization layer, surface of the pad away from the planarization layer being first surface, each pixel unit being provided with one pad electrically coupled to a driving thin film transistor in a corresponding pixel unit through via hole penetrating through the planarization layer; a passivation layer covering the pad layer and including through holes, each pad corresponding to one through hole, such that the first surface of each pad is exposed through corresponding through hole, and area of top opening of through hole is smaller than area of bottom opening thereof. The present disclosure further provides a fabrication method of the display backplane, a display panel and a fabrication method thereof.

14 Claims, 6 Drawing Sheets

DISPLAY BACKPLANE AND FABRICATION METHOD THEREOF, DISPLAY PANEL AND FABRICATION METHOD THEREOF

CROSS-REFERENCE TO RELATED APPLICATIONS

This is a National Phase Application filed under 35 U.S.C. 371 as a national stage of PCT/CN2020/122922 filed Oct. 22, 2020, the content of which is incorporated herein in its entirety by reference.

TECHNICAL FIELD

The present disclosure relates to the field of display technologies, and particularly relates to a display backplane, a fabrication method of the display backplane, a display panel including the display backplane, and a fabrication method of the display panel.

BACKGROUND

Due to the advantages such as short response time, self-luminescence, and solid-state lighting, organic light-emitting diode (OLED) display panels are widely applied. With the consumers' pursuit of display effect, micro-light emitting diode (micro-LED) display panels have appeared on the basis of the OLED display panel.

How to improve the yield in fabricating micro-LED display panels becomes a technical problem to be solved urgently in the field.

SUMMARY

The purpose of the present disclosure is to provide a display backplane, a fabrication method of the display backplane, a display panel including the display backplane, and a fabrication method of the display panel.

As an aspect of the present disclosure, there is provided a display backplane, and the display backplane includes:

an array substrate including at least one pixel unit, and each pixel unit including at least one thin film transistor;

a planarization layer covering the array substrate;

a pad layer including a plurality of pads on the planarization layer, a surface of the pad away from the planarization layer being a first surface, each pixel unit being provided with one of the plurality of pads, and the pad being electrically coupled to a driving thin film transistor in the pixel unit through a via hole which penetrates through the planarization layer; and a passivation layer covering the pad layer and including a plurality of through holes, each of the pads corresponding to one through hole, such that the first surface of each of the pads is exposed through a corresponding through hole, and an area of a top opening of the through hole is smaller than an area of a bottom opening of the through hole.

Optionally, an angle between a sidewall of the through hole and the first surface of the pad layer is between 10° and 80°.

Optionally, a material of the passivation layer is silicon nitride, and a thickness of the passivation layer is between 3000 angstroms and 4000 angstroms.

As a second aspect of the present disclosure, there is provided a display panel, including:

the display backplane according to the first aspect of the present disclosure;

an LED layer including at least one LED unit, wherein each LED unit includes a plurality of LED pins, each of the plurality of LED pins corresponds to one pad, and a portion of each of the plurality of LED pins is arranged in a corresponding through hole and is electrically coupled to the pad.

Optionally, the LED pin includes a pin body and a flange disposed around the pin body, the flange being disposed in the corresponding through hole.

Optionally, the flange is disposed at an end of the pin body facing the pad, and a bottom surface of the flange and a bottom surface of the pin body are both soldered to a corresponding pad.

Optionally, a width of the flange is between 0.1 μm and 0.2 μm.

Optionally, the LED pin includes a pin core and a pin skin cladding the pin core, and a material of the pin skin is a material capable of realizing eutectic soldering.

Optionally, a material of the pin core is copper, and the material of the pin skin is selected from at least one of the following alloys: copper-nickel alloy, copper-tin alloy, and silver-tin alloy.

Optionally, a thickness of the pin skin is no more than one tenth of a diameter of the pin core.

Optionally, the pin core has a diameter between 5000 angstroms and 7000 angstroms.

Optionally, the LED is a micro-LED or a mini-LED.

As a third aspect of the present disclosure, there is provided a fabrication method of a display backplane, and the fabrication method includes:

providing an array substrate, the array substrate including at least one pixel unit, each pixel unit including at least one thin film transistor, and the at least one thin film transistor including a driving thin film transistor;

forming a planarization layer covering the array substrate, the planarization layer being formed with a plurality of via holes, each of the plurality of via holes corresponding to the driving thin film transistor in one pixel unit;

forming a pad layer including a plurality of pads on the planarization layer, a surface of the pad away from the planarization layer being a first surface, each pixel unit being provided with one of the plurality of pads, and the pad being electrically coupled to the driving thin film transistor in the pixel unit through the via hole which penetrates through the planarization layer; and forming a passivation layer covering the pad layer and including a plurality of through holes, each pad corresponding to one through hole, such that the first surface of the pad is exposed through a corresponding through hole, and an area of a top opening of the through hole is smaller than an area of a bottom opening of the through hole.

As a fourth aspect of the present disclosure, there is provided a method of fabricating a display panel, and the method of fabricating the display panel includes:

providing an array substrate, the array substrate including at least one pixel unit, each pixel unit including at least one thin film transistor, and the at least one thin film transistor including a driving thin film transistor;

forming a planarization layer covering the array substrate and formed with a plurality of via holes, each of the plurality of via holes corresponding to the driving thin film transistor in one pixel unit;

forming a pad layer including a plurality of pads on the planarization layer, a surface of the pad away from the planarization layer being a first surface, each pixel unit being provided with one of the plurality of pads, and the pad being electrically coupled to the driving thin film transistor in the pixel unit through the via hole which penetrates through the planarization layer; and forming a passivation layer to obtain a display backplane, the passivation layer covering the pad layer and including a plurality of through holes, each pad corresponding to one through hole, such that the first surface of the pad is exposed through a corresponding through hole, and an area of a top opening of the through hole is smaller than an area of a bottom opening of the through hole; and transferring an LED layer onto the display backplane such that each LED pin of the LED layer falls into a corresponding through hole and contacts with a corresponding pad; and soldering each LED of the LED layer with a corresponding pad through a corresponding LED pin.

BRIEF DESCRIPTION OF THE DRAWINGS

The accompanying drawings, which are to provide a further understanding of the present disclosure and constitute a part of the specification, serve to explain the present disclosure together with the detailed description, but do not constitute a limitation to the present disclosure, in which:

FIG. 3a shows a case where a sidewall of a through hole is a cylindrical surface, and FIG. 3b shows a case where the sidewall of the through hole is a spherical surface;

DETAILED DESCRIPTION

The specific embodiments of the present disclosure are described in detail below in combination with the accompanying drawings. It should be understood that the specific embodiments described herein are only used to illustrate and explain the present disclosure and are not used to limit the present disclosure.

Figure 1:
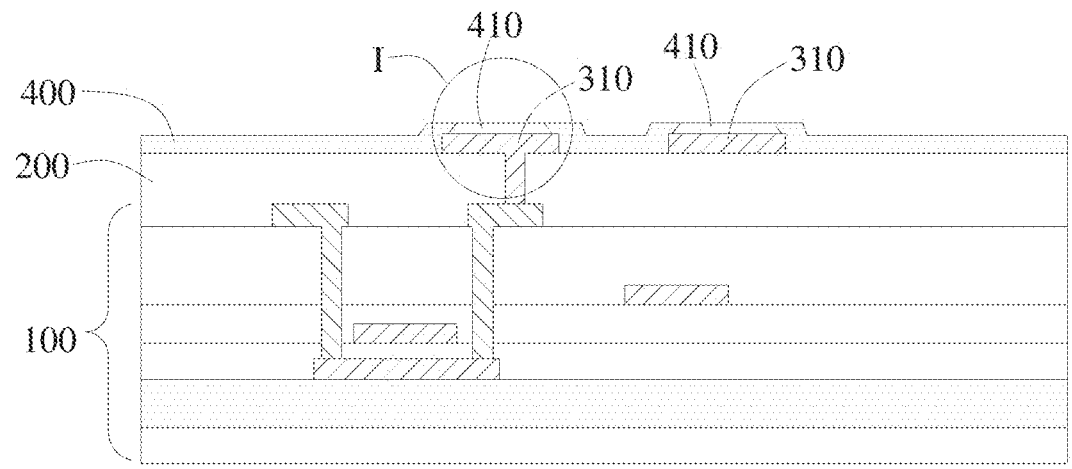
FIG. 1 is a schematic diagram of a partial structure of a display backplane according to an embodiment of the present disclosure.

As a first aspect of the present disclosure, there is provided a display backplane, as shown in FIG. 1, including a thin film transistor (TFT) substrate 100, a planarization layer 200, a pad layer, and a passivation layer 400. It should be noted that the display backplane is a part of a display panel, and specifically, the display backplane may be combined with LEDs and packaged to finally form the display panel.

Figure 2:
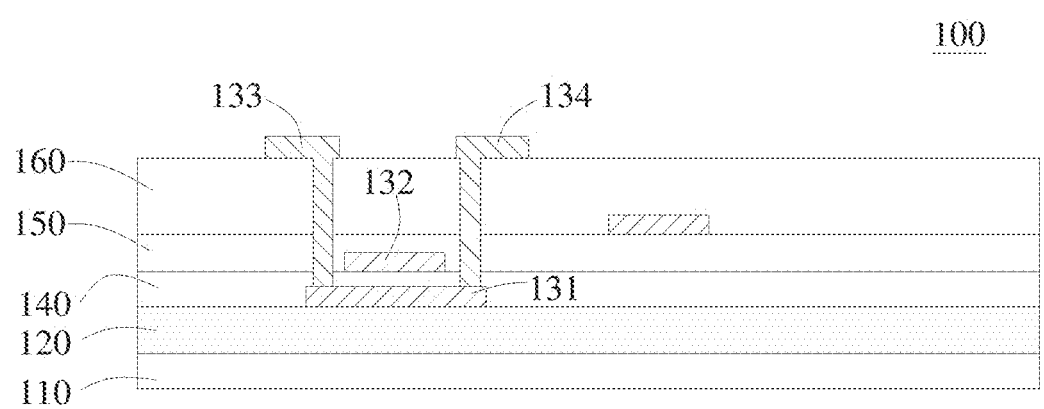
FIG. 2 is a schematic diagram of a partial structure of an array substrate.

As shown in FIG. 2, the array substrate 100 includes at least one pixel unit, and each pixel unit includes at least one thin film transistor. The at least one thin film transistor includes a driving thin film transistor.

The planarization layer 200 covers the array substrate 100, and the pad layer is disposed on the planarization layer 200. In addition, the pad layer includes a plurality of pads 310, and each pad 310 of the pad layer is formed on the planarization layer 200. It should be noted that, the sentence "the planarization layer 200 covers the array substrate 100" here means that the planarization layer 200 and the array substrate 100 are stacked in a thickness direction of the display backplane, the array substrate 100 has a surface facing the planarization layer 200, and the planarization layer 200 is fully distributed on the surface of the array substrate 100 facing the planarization layer 200.

The function of the pad 310 is to provide a soldering point for the LED. Specifically, an anode of the LED is soldered to the pad 310. A surface of the pad 310 facing away from the planarization layer is a first surface, each pixel unit corresponds to one pad 310, and the pad 310 is electrically coupled to a driving thin film transistor in a corresponding pixel unit through a via hole penetrating through the planarization layer 200. It is to be noted that the so-called "first surface" is the surface for soldering, the pins of the LED are soldered to the first surface, and electrical connection of the LED to the pad can be achieved. In the embodiment shown in FIG. 1, the "first surface" of the pad 310 is the upper surface of the pad 310.

The passivation layer 400 covers the pad layer, and the passivation layer 400 includes a plurality of through holes 410, and each of the pads 310 corresponds to one through hole 410, such that the first surface of the pad 310 is exposed through the corresponding through hole 410. As shown in FIG. 3, an area of the top opening of the through hole 410 is smaller than an area of the bottom opening of the through hole 410. The sentence "each of the pads 310 corresponds to one through hole 410" as described here means that the pads 310 and the through holes 410 are in pairs, and the number of the pads 310 is the same as the number of the through holes 410 in the display backplane. In the case that the pad 310 is present, the through hole 410 is present. If the display backplane includes N pads 310, N through holes 410 are also provided in the display backplane, where N is a natural number.

The advantageous effects of the display backplane are described in detail below with reference to FIGS. 4 and 5. When the LED is soldered to the pad 310, LED pins 510 are required. Specifically, the LED pin 510 is soldered to the pad 310. The opening of the through hole 410 is small at the top and large at the bottom, so that the LED pin 510 can be confined in the through hole 410 and cannot be easily removed from the through hole 410. In the process of transferring the display backplane provided with the LED layer onto the welding equipment, the positions of the LED pins 510 are not changed in the case of not increasing additional constraint, so that the yield in fabricating the display panel can be improved.

In the present disclosure, the welding process for soldering the LED pins 510 to the pads 310 is not particularly limited. For example, the LED pins 510 may be soldered to the pads 310 by eutectic soldering.

Eutectic soldering is also known as low melting point alloy soldering. The basic property of eutectic alloys is: two different metals may be alloyed in a certain weight ratio at a temperature well below their respective melting points.

The display backplane according to the present disclosure is particularly suitable for micro-light emitting diode (micro-LED) display panels or mini-LED display panels.

In the micro-LED display panel, the LEDs are closely arranged. Thus, when the LED display panel is fabricated, the display backplane and the LED array need to be fabricated separately, then the closely arranged LED array is transferred onto the display backplane by using a laser-driven bulk transfer process. The LED array includes an LED layer and an LED pin layer. The LED layer includes a plurality of LEDs, and the LED pin layer includes a plurality of LED pins. Each LED corresponds to an LED pin, and the LED pin is electrically coupled to the anode of the LED. In FIGS. 4 and 5, the reference numeral "510" indicates the LED pins.

After the LED array is transferred onto the display backplane, the LED pins 510 contact the first surfaces of the corresponding pads 310 and are confined in the through holes 410, and cannot be easily released from the through holes 410, thereby facilitating each LED in the LED array to be located at the correct position. When the subsequent soldering is carried out, the positions of the LEDs will not be changed, so that the yield in the fabricating the display panel can be improved.

As described above, the area of the top opening of the through hole 410 is smaller than the area of the bottom opening of the through hole 410. For convenience of fabricating, "the area of the top opening of the through hole 410 can be smaller than the area of the bottom opening of the through hole 410" by fabricating the through hole 410 having an inclined sidewall.

As an alternative embodiment, an angle α between the sidewall of the through hole 410 and the first surface of the pad 310 is between 10° and 80°.

It should be noted that the sidewall of the through hole 410 here may be a cylindrical surface, a flat surface, or a spherical surface.

Figure 3A:
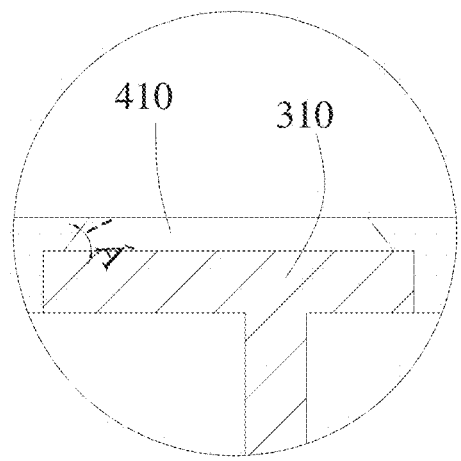
FIGS. 3a and 3b are enlarged schematic diagrams at position I in FIG. 1, where

If the through hole 410 is a frustum hole with a small top and a large bottom (i.e., the longitudinal cross section of the through hole 410 is trapezoidal and the transverse cross section thereof is circular), the sidewall of the through hole 410 is a cylindrical surface. In a cross-sectional view, the sidewall of the through hole 410 appear as a straight line (as shown in FIG. 3a).

Figure 3B:
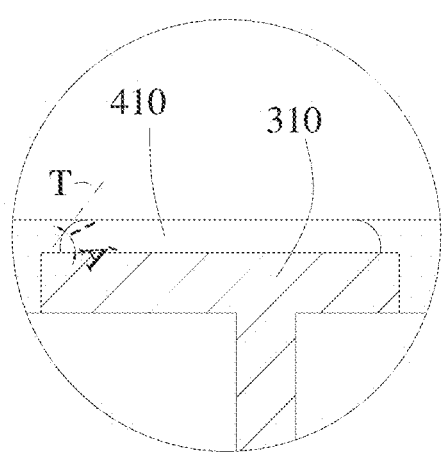

Of course, the sidewall of the through hole 410 is not strictly a cylindrical surface, but may be a spherical surface, as long as the area of the top opening of the through hole 410 is ensured to be smaller than that of the bottom opening thereof. FIG. 3b shows the case where the sidewall of the through hole 410 is a spherical surface. In this case, "the angle α between the sidewall of the through hole 410 and the first surface of the pad 310" refers to the angle between the tangent T of the sidewall of the through hole 410 and the first surface of the pad 310.

In the present disclosure, a specific material of the passivation layer 400 is not particularly limited, and optionally, the material of the passivation layer 400 is silicon nitride, and the thickness of the passivation layer 400 is between 3000 angstroms and 4000 angstroms.

Of course, the present disclosure is not limited thereto, and the passivation layer 400 may be made of silicon oxide, or a mixture of silicon nitride and silicon oxide.

In the present disclosure, the specific structure of the array substrate 100 is not particularly limited. In the embodiment shown in FIG. 2, the thin film transistor in the array substrate 100 is a top gate type thin film transistor. Accordingly, the thin film transistor 100 includes an active pattern layer including an active layer 131, a first gate insulating layer 140, a gate pattern layer including a gate electrode 132, a second gate insulating layer 150, an interlayer insulating layer 160, and a source and drain pattern layer including a source electrode 133 and a drain electrode 134.

The source electrode 133 is coupled to the corresponding active layer 131 through a source via penetrating the interlayer insulating layer 160, the second gate insulating layer 150, and the first gate insulating layer 140, and the drain electrode 134 is coupled to the corresponding active layer 131 through a source via penetrating the interlayer insulating layer 160, the second gate insulating layer 150, and the first gate insulating layer 140.

It should be noted that a pattern layer for forming a capacitor plate or the like is also formed between the second gate insulating layer 150 and the interlayer insulating layer 160.

In the present disclosure, the first and second gate insulating layers 140 and 150 may each be made of silicon oxide, and the interlayer insulating layer 160 may include a silicon oxide layer and a silicon nitride layer, which are stacked.

As a second aspect of the present disclosure, a display panel is provided, and the display panel includes a display backplane, and an LED layer. The display backplane is the display backplane according to the first aspect of the present disclosure.

The LED layer includes at least one LED unit. Each LED unit includes a plurality of LED pins 510, as shown in FIG. 4, each LED pin 510 corresponds to one pad 310, and a portion of the LED pin 510 is disposed in the corresponding through hole 410 and is soldered to the pad 310.

Some of the plurality of LED pins 510 in one LED unit may serve as cathode pins and the other of the plurality of LED pins 510 may serve as anode pins, so that the LEDs in the LED unit may be lighted when the array substrate is powered on.

The sentence "each LED pin 510 corresponds to one pad 310" means that the LED pins 510 and the pads 310 are paired; when there are N LED pins 510 in the display panel, there are N pads 310; and the LED pin 510 can only be soldered to the pad 310 paired with the LED pin 510.

As described above, after the LED array is transferred onto the display backplane, the LED pins 510 contact the first surfaces of the corresponding pads 310 and are confined in the through holes 410. When the display backplane provided with the LED layer is transferred onto a welding equipment, the LED pins 510 cannot be easily released from the through holes 410, so that each LED in the LED array is located at the correct position. When the subsequent welding process is carried out, the positions of the LEDs will not be changed, so that the yield in fabricating the display panel can be improved.

Figure 5:
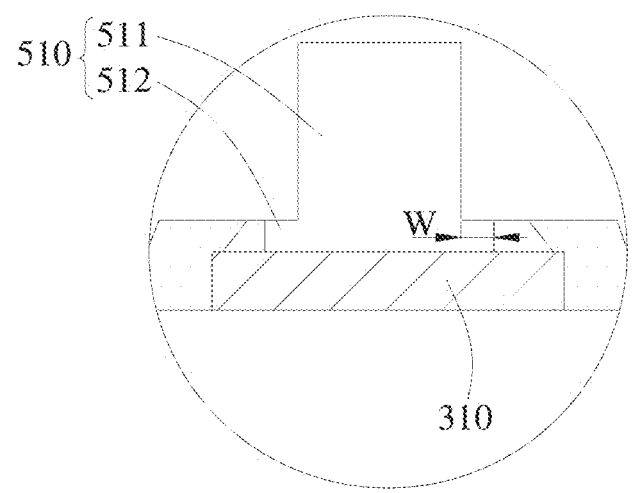
FIG. 5 is an enlarged schematic diagram at position II of FIG. 4.

To further avoid the LED pin 510 from being displaced during the welding process, optionally, as shown in FIG. 5, the LED pin 510 includes a pin body 511 and a flange 512 disposed around the pin body 511, and the flange 512 is disposed in the corresponding through hole.

Figure 4:
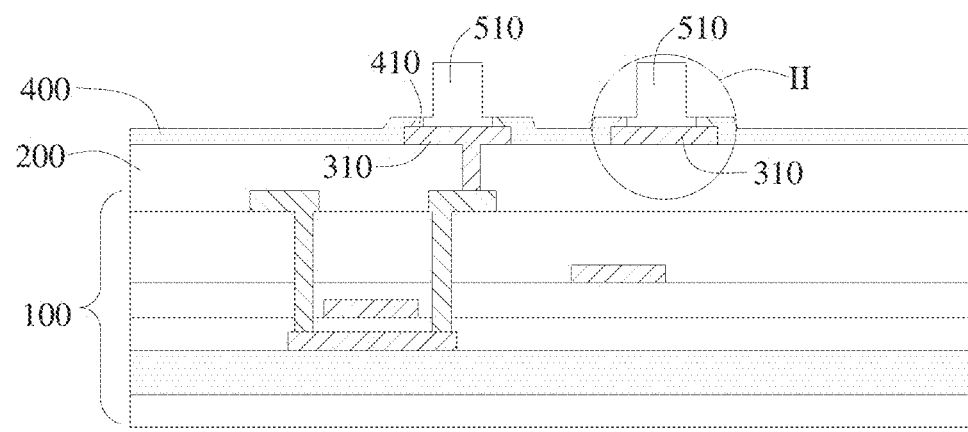
FIG. 4 is a schematic diagram of a partial structure of a display panel according to an embodiment of the present disclosure.

If the LED pin 510 moves in a left-right direction in FIG. 4, the flange 512 is inserted into the gap between the sidewall of the through hole 410 and the first surface of the pad, so that the flange 512 is limited by the upper edge of the through hole 410. In this case, the LED pin 510 will not be released from the through hole 410. Further, when the display backplane provided with the LED layer is transferred onto a welding equipment, the LED pins 510 cannot be easily released from the through holes 410.

In the present disclosure, the specific location of the flange 512 on the pin body 511 is not particularly limited as long as the flange 512 is located in the corresponding through hole 410. In the embodiment shown in FIGS. 4 and 5, the flange 512 is disposed at an end of the pin body 511 facing the pad 310, and a bottom surface of the flange 512 and a bottom surface of the pin body 510 are both soldered to the corresponding pad.

Figure 6:
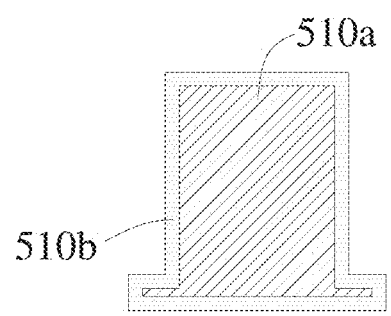
FIG. 6 is a schematic structural diagram of a light emitting diode (LED) pin.

In the present disclosure, the size of the flange 512 is not particularly limited, and as an optional embodiment, a width W of the flange may be between 0.1 µm and 0.2 µm. It is noted that "the width of the flange" refers to a distance between a sidewall of the flange and a sidewall of the pin body 510. As described above, the LED pins 510 are soldered to the pads 310 by eutectic soldering. In order to facilitate the eutectic soldering, as shown in FIG. 6, the LED pin 510 may optionally include a pin core 510a and a pin skin 510b cladding the pin core 510a, and the material of the pin skin 510b is a material capable of achieving eutectic soldering.

As an optional embodiment, the material of the pin core 510a is copper, and the material of the pin skin 510b is selected from at least one of the following alloys: copper-nickel alloy, copper-tin alloy, and silver-tin alloy.

In the present disclosure, the specific thickness of the pin skin 510b is not particularly limited, and optionally, the thickness of the pin skin 510b does not exceed one tenth of the diameter of the pin core 510a.

As an optional embodiment, the thickness of the pin skin 510b may be between 500 and 700 angstroms, and the diameter of the pin core 510a may be between 5000 and 7000 angstroms.

Figure 10:
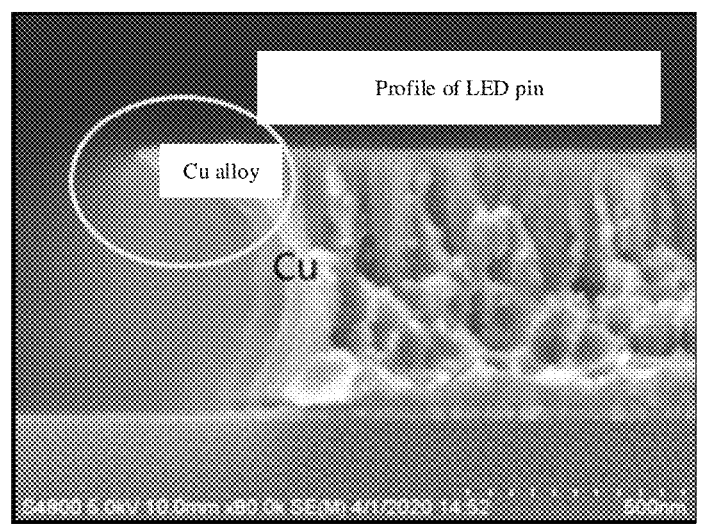
FIG. 10 is a scanning electron microscope image of an LED pin.

FIG. 10 shows a scanned image of the LED pin 510, and in the embodiment shown in FIG. 10, the pin core 510a is made of copper and the pin skin 510b is made of a copper alloy.

In the present disclosure, a cylindrical pin core 510a may be formed first, and then a pin skin 510b may be formed through a patterning process, and in FIG. 10, the portion circled by an ellipse is the flange.

In the present disclosure, the specific type of the LEDs is not particularly limited, and optionally, the LEDs are micro-LEDs.

Optionally, the display panel may further include an encapsulation cover plate encapsulating the display substrate, and other structures.

As described above, in the micro-LED display panel, the LEDs are closely arranged, and thus, when the LED display panel is fabricated, the display backplane and the LED array need to be fabricated separately. Then the closely arranged LED array is transferred onto the display backplane by using a laser-driven bulk transfer process. The LED array includes an LED layer and an LED pin layer, the LED layer includes a plurality of LEDs, and the LED pin layer includes a plurality of LED pins. Each LED corresponds to an LED pin, and the LED pin is electrically coupled to the anode of the LED.

After the LED array is transferred onto the display backplane, the LED pins 510 contact the first surfaces of the corresponding pads 310, are confined in the through holes 410, and cannot be easily released from the through holes 410, thereby facilitating each LED in the LED array to be located at the correct position. When the subsequent soldering is carried out, the positions of the LEDs will not be changed, so that the yield in fabricating the display panel is improved.

Since the micro-LEDs have a response time in the order of nanoseconds (1000 times that of a general OLED display panel), the display panel is particularly suitable for use in a virtual display device. In addition, the micro-LED also has the advantages of high contrast, wide color gamut and applicability to flexible display, which further expands the application range of the display panel.

Of course, the present disclosure is not limited thereto, and the LED may also be a mini-LED.

Figure 7:
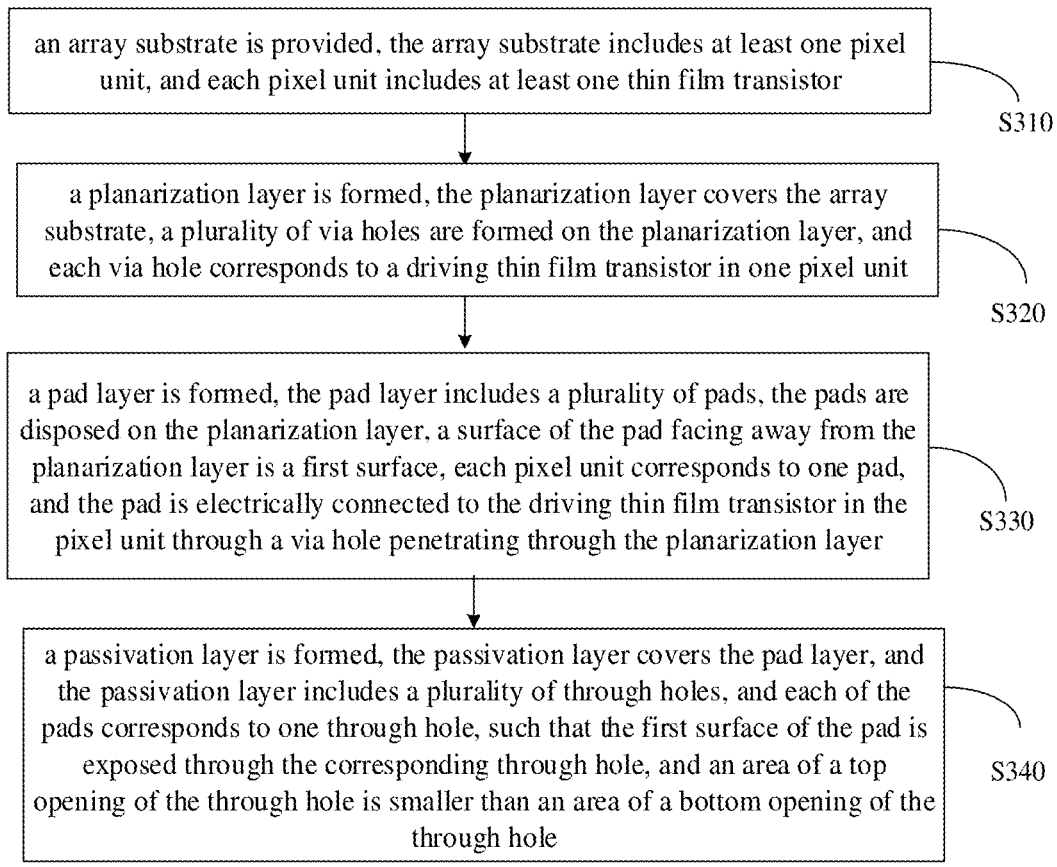
FIG. 7 is a flowchart of a method of fabricating a display backplane according to an embodiment of the present disclosure.

As a third aspect of the present disclosure, there is provided a fabrication method of a display backplane. As shown in FIG. 7, the fabrication method includes the following steps.

In step S310, an array substrate is provided, the array substrate includes at least one pixel unit, and each pixel unit includes at least one thin film transistor.

In step S320, a planarization layer is formed, the planarization layer covers the array substrate, a plurality of via holes are formed on the planarization layer, and each via hole corresponds to a driving thin film transistor in one pixel unit.

In step S330, a pad layer is formed, the pad layer includes a plurality of pads, the pads are disposed on the planarization layer, a surface of the pad facing away from the planarization layer is a first surface, each pixel unit corresponds to one pad, and the pad is electrically connected to the driving thin film transistor in the pixel unit through a via hole penetrating through the planarization layer.

In step S340, a passivation layer is formed, the passivation layer covers the pad layer, and the passivation layer includes a plurality of through holes, and each of the pads corresponds to one through hole, such that the first surface of the pad is exposed through the corresponding through hole, and an area of a top opening of the through hole is smaller than an area of a bottom opening of the through hole.

The fabrication method provided by the present disclosure can be used to fabricate the display backplane according to the first aspect of the present disclosure.

In the present disclosure, the specific steps of step S340 are not particularly limited, and optionally, step S340 may include: forming a passivation material layer, and performing a patterning process on the passivation material layer to form a passivation layer with a plurality of through holes.

In particular, in the step of performing the patterning process on the passivation material layer, a dry etching process may be employed. The through holes can be formed in the passivation material layer by controlling the amount of process gas, the voltages of the upper electrode and the lower electrode of the etching equipment and other process parameters.

Figure 9:
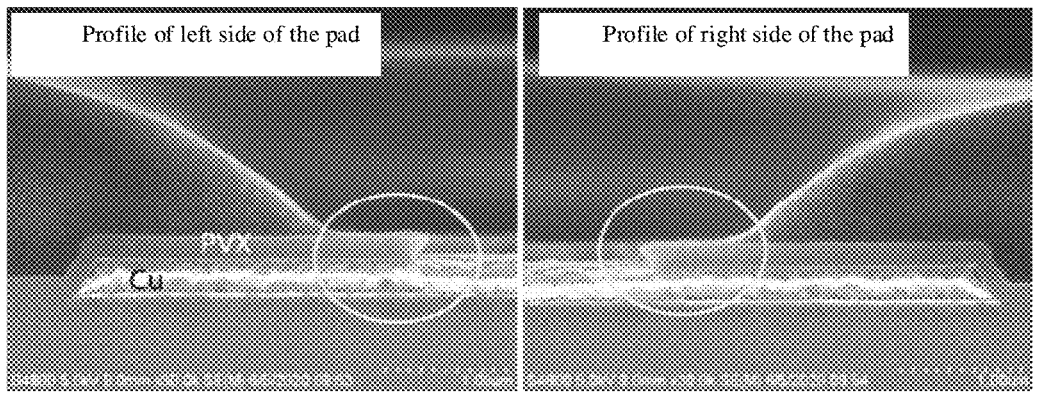
FIG. 9 is a scanning electron microscope image, at a through hole, of a display backplane according to an embodiment of the present disclosure.

FIG. 9 shows a scanning electron microscope image of the display backplane at the through hole, and the angle between the sidewall of the through hole and the first surface of the pad can be clearly seen from the portions circled by two ellipses in the image.

Figure 8:
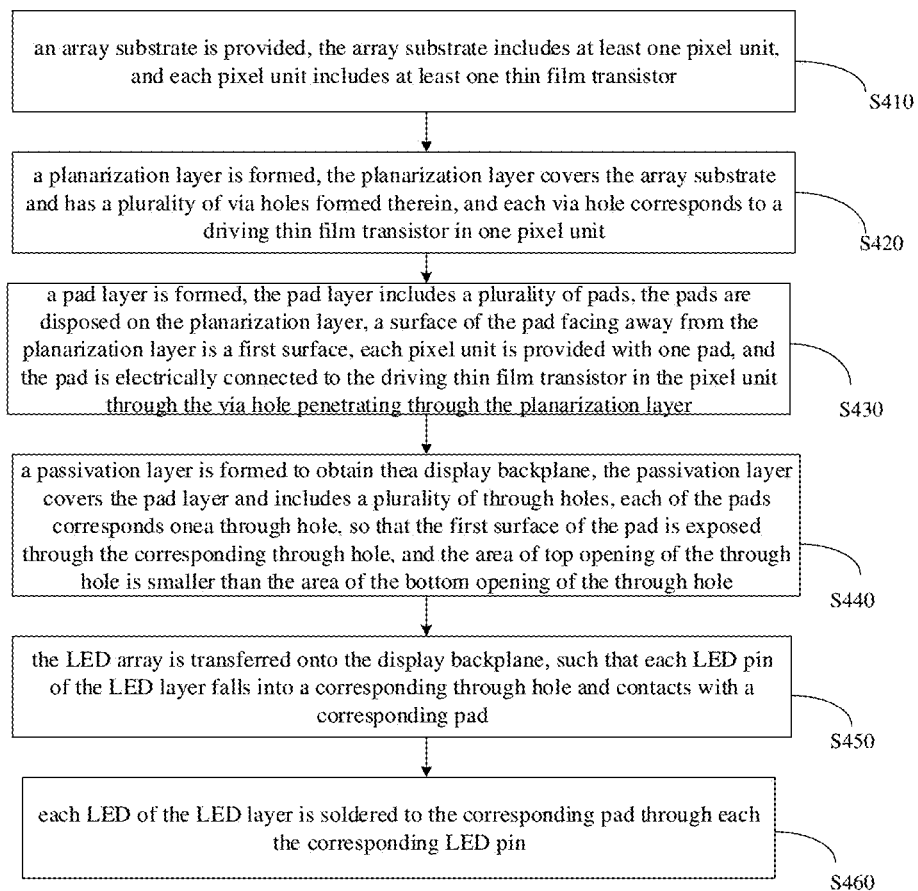
FIG. 8 is a flowchart of a method for fabricating a display panel according to an embodiment of the present disclosure.

As a fourth aspect of the present disclosure, there is provided a method of fabricating a display panel, and as shown in FIG. 8, the method of fabricating a display panel includes the following steps.

In step S410, an array substrate is provided, the array substrate includes at least one pixel unit, and each pixel unit includes at least one thin film transistor. In step S420, a planarization layer is formed, the planarization layer covers the array substrate and has a plurality of via holes formed therein, and each via hole corresponds to a driving thin film transistor in one pixel unit.

In step S430, a pad layer is formed, the pad layer includes a plurality of pads, the pads are disposed on the planarization layer, a surface of the pad facing away from the planarization layer is a first surface, each pixel unit is provided with one pad, and the pad is electrically connected to the driving thin film transistor in the pixel unit through the via hole penetrating through the planarization layer;

In step S440, a passivation layer is formed to obtain the display backplane, the passivation layer covers the pad layer and includes a plurality of through holes, each of the pads corresponds one through hole, so that the first surface of the pad is exposed through the corresponding through hole, and the area of top opening of the through hole is smaller than the area of the bottom opening of the through hole.

In step S450, the LED array is transferred onto the display backplane, such that each LED pin of the LED layer falls into a corresponding through hole and contacts with a corresponding pad;

In step S460, each LED of the LED layer is soldered to the corresponding pad through the corresponding LED pin.

As described above, the opening of the through hole is small at the top and large at the bottom, so that the LED pin 510 can be confined in the through hole 410 and cannot be easily released from the through hole 410. In the process of transferring the display backplane provided with the LED layer onto the welding equipment, the positions of the LED pins 510 are not changed under the condition of not increasing additional constraint, so that the yield in fabricating the display panel can be improved.

In the present disclosure, when the LED is a micro-LED or a mini-LED, the step S450 may be implemented by a laser-driven bulk transfer process.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

What is claimed is:

1. A display backplane, characterized in that the display backplane comprises:
    an array substrate comprising at least one pixel unit, each pixel unit comprising at least one thin film transistor;
    a planarization layer covering the array substrate;
    a pad layer comprising a plurality of pads on the planarization layer, a surface of the pad away from the planarization layer being a first surface, each pixel unit being provided with one of the plurality of pads, and the pad being electrically coupled to a driving thin film transistor in the pixel unit through a via hole which penetrates through the planarization layer; and
    a passivation layer covering the pad layer and comprising a plurality of through holes, each of the plurality of pads corresponding to one through hole, such that the first surface of each of the plurality of pads is exposed through a corresponding through hole, and an area of a top opening of the through hole is smaller than an area of a bottom opening of the through hole.

2. The display backplane of claim 1, characterized in that an angle between a sidewall of the through hole and the first surface of the pad layer is between 10° and 80°.

3. The display backplane of claim 1, characterized in that a material of the passivation layer is silicon nitride, and a thickness of the passivation layer is between 3000 angstroms and 4000 angstroms.

4. A display panel, characterized in that the display panel comprises:
    a display backplane, the display backplane being the display backplane of claim 1;
    a light emitting diode (LED) layer comprising at least one LED unit, wherein
    each LED unit comprises a plurality of LED pins, each of the plurality of LED pins corresponds to one of the plurality of pads, and a portion of each of the plurality of LED pins is arranged in a corresponding through hole and is electrically coupled to the pad.

5. The display panel of claim 4, characterized in that the LED pin comprises a pin body and a flange around the pin body, the flange being disposed in the corresponding through hole.

6. The display panel of claim 5, characterized in that the flange is disposed at an end of the pin body facing the pad, and a bottom surface of the flange and a bottom surface of the pin body are both soldered to a corresponding pad.

7. The display panel of claim 5, characterized in that a width of the flange is between 0.1 μm and 0.2 μm.

8. The display panel of claim 4, characterized in that the LED pin comprises a pin core and a pin skin cladding the pin core, and a material of the pin skin is a material capable of eutectic soldering.

9. The display panel of claim 8, characterized in that a material of the pin core is copper, and the material of the pin skin is selected from at least one of the following alloys: copper-nickel alloy, copper-tin alloy, and silver-tin alloy.

10. The display panel of claim 8, characterized in that a thickness of the pin skin is no more than one tenth of a diameter of the pin core.

11. The display panel of claim 10, characterized in that the pin core has a diameter between 5000 angstroms and 7000 angstroms.

12. The display panel of claim 4, characterized in that the LED is a micro-LED or a mini-LED.

13. A fabrication method of a display backplane, characterized in that the fabrication method comprises:
    providing an array substrate, the array substrate comprising at least one pixel unit, each pixel unit comprising at least one thin film transistor, and the at least one thin film transistor comprising a driving thin film transistor;
    forming a planarization layer covering the array substrate, the planarization layer being formed with a plurality of via holes, each of the plurality of via holes corresponding to the driving thin film transistor in one pixel unit;
    forming a pad layer comprising a plurality of pads on the planarization layer, a surface of the pad away from the planarization layer being a first surface, each pixel unit being provided with one of the plurality of pads, and the pad being electrically coupled to the driving thin film transistor in the pixel unit through the via hole which penetrates through the planarization layer; and
    forming a passivation layer covering the pad layer and comprising a plurality of through holes, each pad corresponding to one through hole, such that the first surface of the pad is exposed through a corresponding through hole, and an area of a top opening of the through hole is smaller than an area of a bottom opening of the through hole.

14. A fabrication method of a display panel, characterized in that the fabrication method of the display panel comprises:
- providing an array substrate, the array substrate comprising at least one pixel unit, each pixel unit comprising at least one thin film transistor, and the at least one thin film transistor comprising a driving thin film transistor;
- forming a planarization layer covering the array substrate and formed with a plurality of via holes, each of the plurality of via holes corresponding to the driving thin film transistor in one pixel unit;
- forming a pad layer comprising a plurality of pads on the planarization layer, a surface of the pad away from the planarization layer being a first surface, each pixel unit being provided with one of the plurality of pads, and the pad being electrically coupled to the driving thin film transistor in the pixel unit through the via hole which penetrates through the planarization layer;
- forming a passivation layer to obtain a display backplane, the passivation layer covering the pad layer and comprising a plurality of through holes, each pad corresponding to one through hole, such that the first surface of the pad is exposed through a corresponding through hole, and an area of a top opening of the through hole is smaller than an area of a bottom opening of the through hole; and
- transferring a light emitting diode (LED) layer onto the display backplane such that each LED pin of the LED layer falls into a corresponding through hole and contacts with a corresponding pad; and
- soldering each LED of the LED layer with a corresponding pad through a corresponding LED pin.

* * * * *